US010840104B2

(12) United States Patent
Bergman et al.

(10) Patent No.: US 10,840,104 B2
(45) Date of Patent: Nov. 17, 2020

(54) CONTROLLED ETCH OF NITRIDE FEATURES

(71) Applicant: Applied Materials, Inc., Santa Clara, CA (US)

(72) Inventors: Eric J. Bergman, Kalispell, MT (US); John L. Klocke, Kalispell, MT (US); Charles Sharbono, Whitefish, MT (US); Kyle Moran Hanson, Kalispell, MT (US); Paul McHugh, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/036,617

(22) Filed: Jul. 16, 2018

(65) Prior Publication Data
US 2019/0019688 A1 Jan. 17, 2019

Related U.S. Application Data

(60) Provisional application No. 62/533,415, filed on Jul. 17, 2017.

(51) Int. Cl.
*H01L 21/311* (2006.01)
*H01L 21/324* (2006.01)
(Continued)

(52) U.S. Cl.
CPC ...... *H01L 21/31111* (2013.01); *H01L 21/324* (2013.01); *H01L 21/68764* (2013.01);
(Continued)

(58) Field of Classification Search
CPC ......... H01L 21/31111; H01L 21/68764; H01L 21/324; H01L 21/02164; H01L 21/022; H01L 21/0217
See application file for complete search history.

(56) References Cited

U.S. PATENT DOCUMENTS

2015/0371869 A1 12/2015 Surla et al.
2016/0013068 A1* 1/2016 Butterbaugh ..... H01L 21/31111
438/748
(Continued)

FOREIGN PATENT DOCUMENTS

KR 10-0823461 B1 4/2008
KR 10-2011-0037741 A 4/2011
KR 10-2013-0073251 A 7/2013

OTHER PUBLICATIONS

International Search Report and Written Opinion dated Oct. 31, 2018 in Patent Application No. PCT/US2018/042304, all pages.

*Primary Examiner* — Duy Vu N Deo
(74) *Attorney, Agent, or Firm* — Kilpatrick Townsend & Stockton LLP

(57) ABSTRACT

Methods of etching a semiconductor substrate may include applying an etchant to the semiconductor substrate. The semiconductor substrate may include an exposed region of an oxygen-containing material and an exposed region of a nitrogen-containing material. The methods may include heating the semiconductor substrate from a first temperature to a second temperature. The methods may include maintaining the semiconductor substrate at the second temperature for a period of time sufficient to perform an etch of the nitrogen-containing material relative to the oxygen-containing material. The methods may also include quenching the etch subsequent the period of time.

19 Claims, 2 Drawing Sheets

(51) Int. Cl.
*H01L 21/687* (2006.01)
*H01L 21/02* (2006.01)
(52) U.S. Cl.
CPC ........ *H01L 21/022* (2013.01); *H01L 21/0217* (2013.01); *H01L 21/02164* (2013.01)

(56) References Cited

U.S. PATENT DOCUMENTS

| | | | | |
|---|---|---|---|---|
| 2016/0049308 A1* | 2/2016 | Hinode | ............. | H01L 21/67028 |
| | | | | 216/93 |
| 2016/0126107 A1 | 5/2016 | Kil et al. | | |
| 2016/0343580 A1* | 11/2016 | Hudson | ............. | H01J 37/32513 |

* cited by examiner

CONTROLLED ETCH OF NITRIDE FEATURES

CROSS-REFERENCE TO RELATED APPLICATIONS

This application claims the benefit of U.S. Provisional Application No. 62/533,415, filed Jul. 17, 2017, and which is hereby incorporated by reference in its entirety for all purposes.

TECHNICAL FIELD

The present technology relates to etching materials on a semiconductor substrate. More specifically, the present technology relates to controlled etches that may be performed to uniformly etch materials along a semiconductor substrate.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etch processes may penetrate into intricate features and trenches, but may not provide acceptable top-to-bottom profiles. As device sizes continue to shrink in next-generation devices, selectivity may play a larger role when only a few nanometers of material are formed in a particular layer, especially when the material is critical in the transistor formation. Many different etch process selectivities have been developed between various materials, although standard selectivities may no longer be suitable at current and future device scale.

Thus, there is a need for improved systems and methods that can be used to produce high quality devices and structures. These and other needs are addressed by the present technology.

SUMMARY

Systems and methods of etching a semiconductor substrate may include applying an etchant to the semiconductor substrate. The semiconductor substrate may include an exposed region of an oxygen-containing material and an exposed region of a nitrogen-containing material. The methods may include heating the semiconductor substrate from a first temperature to a second temperature. The methods may include maintaining the semiconductor substrate at the second temperature for a period of time sufficient to perform an etch of the nitrogen-containing material relative to the oxygen-containing material. The methods may also include quenching the etch subsequent the period of time.

In some embodiments, the first temperature may be below or about 100° C. The second temperature may be above or about 100° C. The etchant may be or include phosphoric acid at a concentration of at least about 60% by volume. The etchant may also include tetraethyl orthosilicate. The period of time may be less than or about 60 seconds. The semiconductor substrate may be heated from the first temperature to the second temperature in less than or about 10 seconds. The quenching may include contacting the semiconductor substrate with a volume of deionized water. The quenching may reduce the etch rate by at least a factor of 10 in less than or about 10 seconds.

The present technology also includes methods of etching a semiconductor substrate. The methods may include applying an etchant to the semiconductor substrate. The semiconductor substrate may include alternating layers of an oxide material and a nitride material. The methods may include heating the semiconductor substrate from a first temperature to a second temperature greater than or about 100° C. in less than or about 30 seconds. The methods may include maintaining the semiconductor substrate at the second temperature for a period of time. The methods may include etching the nitride material relative to the oxide material at a selectivity greater than or about 10:1. The methods may also include diluting the etchant to terminate the etching.

In some embodiments, the semiconductor substrate may be heated to a temperature of above or about 150° C. Less than or about 200 mL of etchant may be applied to the semiconductor substrate. The methods may further include rotating the semiconductor substrate during the heating. A rate of etching the nitride material may be greater than or about 100 Å per minute. The nitride material may be etched uniformly across the semiconductor substrate within a tolerance of less than or about 30% of an amount of the nitride material etched. Diluting the etchant may reduce a temperature of the etchant below about 100° C. in less than or about 10 seconds. The etchant may include phosphoric acid at a concentration of at least about 75% by volume. The etchant may also include at least one of tetraethyl orthosilicate or ammonium fluoride. Additional etchant may not be applied during the etching process in some embodiments. The amount of nitride material etched may be less than or about 100 Å.

Such technology may provide numerous benefits over conventional technology. For example, the present etch processes may improve uniformity across features on a semiconductor substrate. Additionally, the present methodology may allow improved control over the initiation and termination of the etch process. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
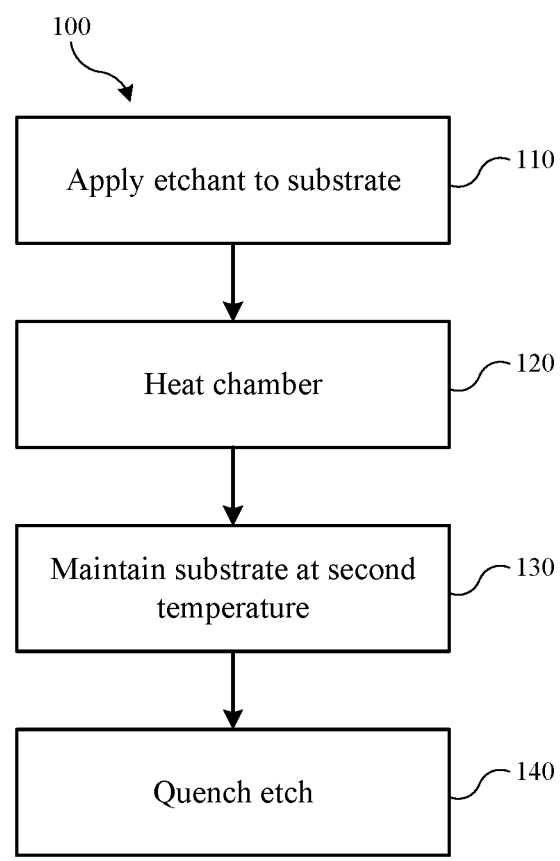
FIG. 1 shows operations of a method of etching a semiconductor substrate according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Device patterning and features that continue to shrink in dimension may include delicate features etched or formed on a substrate. For example, many processing operations may work upon or form trenches in a substrate or materials on a substrate. The aspect ratio, defined as the height to width ratio, may be high in current devices, and can be on the order of 5, 10, 20, 50, 100 or greater. Additionally, different regions of a semiconductor substrate may include features having different depths or widths creating an inconsistent topography across the substrate surface. These regions may react differently to etchants applied to the substrate. For example, etchants may not penetrate high aspect ratio features at the same rate as low aspect ratio features. This may cause different etch rates across the substrate, and may also cause different etch rates within individual features, such as from the top to the bottom of a trench or aperture.

Conventional techniques have not properly addressed these issues, especially for processes designed to remove minute amounts of material in a repeatable way. For example, many plasma and wet etch processes begin etching substrate materials on contact, which will remove material at the top of a feature before the etchant has reached the bottom of the feature. This may cause sloped sidewalls and other irregularities across the features of a substrate. The present technology utilizes an etchant process that allows improved control over initiation and termination of the etch process, which may allow improved uniformity of etching compared to conventional processes. By applying an etchant in a less reactive form, the etching process may be delayed until the etchant has been uniformly applied to the substrate. The etchant may then be activated, which may allow a uniform etch process to occur across the substrate prior to termination.

Although the remaining portions of the specification will routinely reference semiconductor processing, the present techniques should not be considered limited to semiconductors. For example, many technologies seek to perform material removal on a relatively small scale or across a material that may not include uniform features. The present etching and removal techniques may be suitable for these technologies as well, which may afford a uniform removal both across and within features of a substrate.

Turning to FIG. 1 is shown a method 100 of etching a semiconductor substrate according to embodiments of the present technology. The method may include applying an etchant to the semiconductor substrate at operation 110. The application may occur within a semiconductor processing chamber housing the substrate. The etchant may be applied by any number of fluid delivery operations including spraying, flooding, flowing, or otherwise delivering the etchant from above, below, or tangentially to the substrate. The substrate may be seated on a pedestal or chuck, which may clamp or otherwise seat the substrate during the method 100. The substrate may have had one or more processing operations performed to define features on or within the substrate, which may expose one or more materials to the etchant applied.

In some embodiments, the substrate may include a feature having sidewalls defined by one or more materials. For example, a trench, pillar, fin, or hole may be formed through layered materials. The layered materials may include two or more layers of materials, which may include alternating materials in embodiments. For example, an exemplary structure may be or include two or more materials layered together over a substrate, or as a substrate. The materials may include any number of materials used in semiconductor processing including silicon-containing materials, oxygen-containing materials, nitrogen-containing materials, and other metal and non-metal materials. In one exemplary structure encompassed by the present technology, layers of silicon oxide, or some other metal oxide, and layers of silicon nitride, or some other metal nitride, may be included in alternating layers. The structure may include any number of layers as will be discussed further below.

One or more features may be defined by or through the alternating layers of the structure, including any of the features previously noted. The feature may have sidewalls or other surfaces defined by the one or more alternating materials. Accordingly, the substrate may include one or more exposed materials that may be contacted by the etchant when applied. For example, a structure including the materials noted above may include an exposed region of an oxygen-containing material, which may be silicon oxide, and the structure may include an exposed region of a nitrogen-containing material, which may be silicon nitride. In embodiments, the substrate may include a plurality of features defined about the substrate, such as a variety of trenches or structures defined through the alternating layers of material. The substrate may be any of a variety of sizes and shapes from 200 mm, 300 mm, 450 mm, 600 mm, or larger substrates used for technologies including semiconductors, solar collectors, microfluidic devices, or other structures.

The etchant may be applied to the substrate, such as by spraying or other application, and the etchant may be allowed or caused to flow within and about the defined features on the substrate. The etchant may be applied to the substrate at a first temperature, which may be a temperature at which the etchant is less active, substantially unreactive, or essentially unreactive with the exposed materials on the substrate. This may allow the etchant to be uniformly applied across the substrate and delivered into high aspect ratio features to expose all surfaces to the etchant prior to an etching process. In this way, preferential etching by the etchant at a point of contact on the substrate may be reduced or minimized before the etchant has contacted all surfaces.

Once the etchant has extended across the substrate and penetrated the features of the substrate, the substrate may be heated from the first temperature to a second temperature at operation 120. The second temperature may be a temperature at which the etchant begins reacting with one or more exposed surfaces on the substrate. The substrate may be maintained at the second temperature at operation 130. The substrate may be maintained at the second temperature for a period of time sufficient to perform an etch of one exposed material relative to another exposed material on the substrate. Subsequent the period of time, the etch process may be terminated at operation 140.

Exemplary embodiments encompassed by the present technology may include etching structures subsequent formation of features. For example, some memory structures may include alternating layers of material in which holes or trenches are defined. In one embodiment, the features may include alternating layers of oxide and nitride. The etch performed may include a plasma etch or a wet etch process that defines the recess. This etch may not fully define the sidewall of the feature, and one of the layered materials may be etched more than the other layered material. The offset between the materials may depend on the materials forming the layers of material as well as the etch process performed. In some embodiments the nitride material may extend slightly into the trench formed, while in other embodiments the layers of oxide material may extend slightly into the feature formed. These overhangs of material may provide challenges for subsequent deposition, etching, or other processes performed, and may affect device quality. The present technology may be used to even or true the sidewalls of the features.

The amount of material offset may be less than or about 500 nm in embodiments, while in other embodiments the amount of material offset may be greater than or about 500 nm. Additionally, the amount of offset may be less than or about 400 nm, less than or about 300 nm, less than or about 200 nm, less than or about 150 nm, less than or about 100 nm, less than or about 50 nm, less than or about 30 nm, less than or about 20 nm, less than or about 10 nm, less than or about 5 nm, less than or about 3 nm, less than or about 1 nm, less than or about 9 Å, less than or about 8 Å, less than or about 7 Å, less than or about 6 Å, less than or about 5 Å, less than or about 4 Å, less than or about 3 Å, or less, such as about a monolayer of material. The nitride material may be slightly pronounced from the oxide material in embodiments, and the etchant used may be configured to remove excess nitride material while limiting removal of oxide material.

In embodiments in which the nitride material extends past the oxide material, the etchant may be or include phosphoric acid. In other embodiments in which different materials are included, or in which a different material is sought to be etched, a different etchant may be utilized. The phosphoric acid may be applied at a variety of concentrations, which may affect selectivity and rate of etching. For example, as phosphoric acid concentration is increased, the etch rate of silicon nitride may increase. In embodiments, the etchant may include phosphoric acid at a concentration above or about 50%. The phosphoric acid concentration may also be above or about 60%, above or about 70%, above or about 80%, or may be above or about 90%. In some embodiments, the concentration may be between about 60% and about 90%. The etchant may include one or more additives as well, which may include ammonium fluoride, tetraethyl orthosilicate, or other materials that may affect the boiling point, reactivity, or other properties of the etchant. For example, tetraethyl orthosilicate may be included when the alternating material includes silicon oxide. The additive may incorporate soluble silicates within the etchant, which may at least partially inhibit an etch rate of silicon oxide. This may increase the selectivity of the etchant to silicon nitride relative to silicon oxide in embodiments. Other materials that may provide soluble silicates may also be useful, and may include silicic acid, including orthosilicic acid, disilicic acid, metasilicic acid, or pyro silicic acid, or other silicon-containing molecules coupled with oxide and/or hydroxide groups. Additional, materials may include sodium silicate, or other silicon or silicate-containing materials that may be included in the solution. Along with ammonium fluoride, the materials may include hydrofluoric acid, hexafluorosilicic acid, ammonium bifluoride, or other fluorine-providing materials. Additionally, combinations of any of these materials may also be used.

The present technology may provide a selectivity of etching silicon nitride relative to silicon oxide of greater than or about 10:1 in embodiments. The present technology may also provide a method that etches silicon nitride relative to silicon oxide with a selectivity greater than or about 20:1, greater than or about 30:1, greater than or about 50:1, greater than or about 100:1, greater than or about 150:1, greater than or about 200:1, greater than or about 250:1, greater than or about 300:1, greater than or about 350:1, greater than or about 400:1, greater than or about 450:1, greater than or about 500:1, greater than or about 550:1, greater than or about 600:1, greater than or about 650:1, greater than or about 700:1, greater than or about 750:1, greater than or about 800:1, greater than or about 850:1, greater than or about 900:1, greater than or about 950:1, greater than or about 1000:1, or more.

An etch rate of silicon nitride according to the present technology may be greater than or about 10 Å/min in embodiments, and the etch rate may be greater than or about 50 Å/min, greater than or about 60 Å/min, greater than or about 70 Å/min, greater than or about 80 Å/min, greater than or about 90 Å/min, greater than or about 100 Å/min, greater than or about 110 Å/min, greater than or about 120 Å/min, greater than or about 130 Å/min, greater than or about 140 Å/min, greater than or about 150 Å/min, greater than or about 160 Å/min, greater than or about 170 Å/min, greater than or about 180 Å/min, greater than or about 190 Å/min, greater than or about 200 Å/min, greater than or about 210 Å/min, greater than or about 220 Å/min, greater than or about 230 Å/min, greater than or about 240 Å/min, greater than or about 250 Å/min, greater than or about 260 Å/min, greater than or about 270 Å/min, greater than or about 280 Å/min, greater than or about 290 Å/min, greater than or about 300 Å/min, or higher depending on the materials included in the etchant, and the designed amount of removal for the process.

For example, some embodiments of the present technology may involve removing an overhang of silicon nitride relative to layers of silicon nitride. The overhang may be limited to less than 50 nm of material, and may be less than or about 40 nm, less than or about 30 nm, less than or about 20 nm, less than or about 10 nm, less than or about 90 Å, less than or about 80 Å, less than or about 70 Å, less than or about 60 Å, less than or about 50 Å, less than or about 40 Å, less than or about 30 Å, less than or about 20 Å, less than or about 10 Å, less than or about 5 Å, or less, and may be down to a monolayer of material. Accordingly, an etch rate of 100 Å/min or less may afford increased control over the process to protect against substantial overetch. Other embodiments may involve a more pronounced etch in which more than 50 nm of silicon nitride may be removed, however processes including removal of hundreds of nanometers of material may include refreshing the etchant on the substrate. In these processes, an enhanced etch rate may afford higher selectivity relative to oxide in some embodiments.

The amount of etchant applied to the substrate may depend on the amount of etch being performed, the size of the substrate, or other variables. In some embodiments, a surface coating of etchant may be applied to perform the etch process, which may provide sufficient etchant to coat the substrate and fill features across and through the substrate surface. By limiting the amount of etchant applied to the substrate, termination of the etch process may be facilitated, as well as heating of the substrate and etchant. As one non-limiting example, for a substrate of 300 mm, the amount of etchant applied may be less than or about 200 mL, less than or about 150 mL, less than or about 100 mL, less than or about 80 mL, less than or about 60 mL, less than or about 50 mL, less than or about 40 mL, less than or about 30 mL, less than or about 20 mL, or less.

The first temperature and the second temperature may be at least partially based on effective temperatures of the etchant. For example, etchants including phosphoric acid may have reduced effectiveness below about 100° C. at ambient pressure, depending on incorporated additives. In embodiments, the first temperature may be below or about 100° C., and the second temperature may be above or about 100° C. For example, the first temperature may be below or about 90° C., below or about 80° C., below or about 70° C., below or about 60° C., below or about 50° C., below or about 40° C., below or about 30° C., below or about 25° C., or may be about an ambient environmental temperature in embodiments. The first temperature may be maintained above a melting point or crystallization temperature of any material included in the etchant.

The second temperature may be a temperature determined to produce an etch process in which nitride may be selectively etched relative to oxide. For example, the second temperature may be above about 100° C., and may be above or about 110° C., above or about 120° C., above or about 130° C., above or about 140° C., above or about 150° C., above or about 160° C., above or about 170° C., above or about 180° C., above or about 190° C., above or about 200° C., or higher in embodiments. The temperature may be maintained at the second temperature for a period of time based on a continued or maintained application of heat during the period of time. In some embodiments, the temperature may be maintained about a boiling point of the etchant, which may be between about 150° C. and about 200° C. depending on the materials and additives included in the etchant. By performing the etch at a temperature about the boiling point of the etchant, the etch process may be performed isothermally, which may provide additional control over the etch process and rate.

Heating operation 120 may be performed rapidly in embodiments to provide a more distinct time in which the etch process is initiated. For example, heat may be applied to a processing chamber or to the substrate via heat lamps, a hot plate, IR energy, or other heat sources that may be applied to the substrate and/or etchant. The wafer may be rotated or otherwise manipulated during the heating to increase uniformity of the heating across the substrate. The heating operation may increase the temperature of the substrate and/or etchant from the first temperature to the second temperature in less than or about 30 seconds, and may increase the temperature from the first temperature to the second temperature in less than or about 25 seconds, less than or about 20 seconds, less than or about 15 seconds, less than or about 10 seconds, less than or about 5 seconds, or less. By applying the etchant prior to heating, a more uniform temperature may be realized during the process, as all etchant may be heated concurrently. Similarly, in some embodiments the etchant may not be refreshed during the method, which may reduce heat sink effects across the substrate as additional etchant is delivered.

In some embodiments, an additional heating may be performed to facilitate application of the etchant and enhance etchant flow among features on the substrate. For example, the etchant may be more viscous at ambient temperatures, and thus during application of the etchant to the substrate, the temperature may be increased from ambient to a temperature below or about 100° C., which may reduce viscosity of the etchant, while still minimizing etch characteristics. The etchant may be heated to above or about 50° C., above or about 60° C., above or about 70° C., above or about 80° C., above or about 90° C., or higher in embodiments.

The substrate and or etchant may be maintained at the second temperature for a period of time sufficient to conduct the etch. The period of time may be based on the amount of material being etched in embodiments, and on the amount of material that may be etched by the etchant without refreshing the etchant. For example, if the etch rate of the etchant is 100 Å/min of nitride material, and the amount of material to be removed is 100 Å of nitride, the period of time may be about one minute before the process is terminated. In some embodiments, the period of time may be less than or about 5 minutes, and the period of time may be less than or about 4 minutes, less than or about 3 minutes, less than or about 2 minutes, less than or about 60 seconds, less than or about 50 seconds, less than or about 40 seconds, less than or about 30 seconds, less than or about 20 seconds, less than or about 10 seconds, or less in embodiments.

Once the etch process has removed sufficient material, the etch process may be terminated by ceasing the application of heat, and/or otherwise halting the etch process. In one embodiment, the etch process may be quenched by application of a diluent or other material that may perform one or more actions of diluting the etchant, and/or reducing a temperature of the etchant. For example, a volume of diluent may be poured, flowed, or applied to the substrate to quench the process. The diluent may be a basic fluid, water, such as deionized water, or the diluent may be any other material that may reduce the etching capability of the etchant in one or more ways. The etch process may be quenched by contacting the etchant with a volume of the diluent. The diluent applied may be at ambient temperature, and may be applied in a volume greater than the amount of etchant contained on the substrate.

For example, deionized water may be applied at a rate of greater than or about 1 L/minute, greater than or about 1.5 L/min, greater than or about 2 L/M, or greater, to reduce the etching capability of the etchant by reducing the temperature and the concentration of the etchant. The diluent may be applied to reduce the etch rate of the etchant by at least a factor of 5 in less than or about 10 seconds, and may reduce the etch rate in less than or about 8 seconds, less than or about 6 seconds, less than or about 5 seconds, less than or about 4 seconds, less than or about 3 seconds, less than or about 2 seconds, or less. The diluent may also be applied to reduce the etch rate of the etchant by at least a factor of 10, at least a factor or 20, at least a factor of 100, or more, in any of the time periods noted. The diluent may also reduce a temperature of the etchant below about 100° C. in less than or about 10 seconds, less than or about 8 seconds, less than or about 6 seconds, less than or about 4 seconds, or less.

Subsequent the termination of the etching operation, other optional operations may be performed as well. For example, during the etching, particles of material may be removed or dislodged, which may adhere to surfaces of the substrate.

Additional cleaning operations may be performed to reduce contamination or assist in removing particles from the substrate. For example, a sonic cleaning operation may be performed as well as other rinses and drying operations typical in semiconductor processing. By performing methods according to the present technology, a more uniform etch process may be provided. Because the etch process may not be initiated until the etchant has been distributed uniformly across the substrate, the etch may be limited until performance may occur on all surfaces simultaneously. Similarly, because the etch process may be quenched rapidly and uniformly along all depths and across the substrate, the present technology may provide a more uniform termination along all areas of the substrate. This may provide greater control to both initiation and termination of the etch process, which may be essentially commonly started and stopped across the substrate.

Figure 2A:
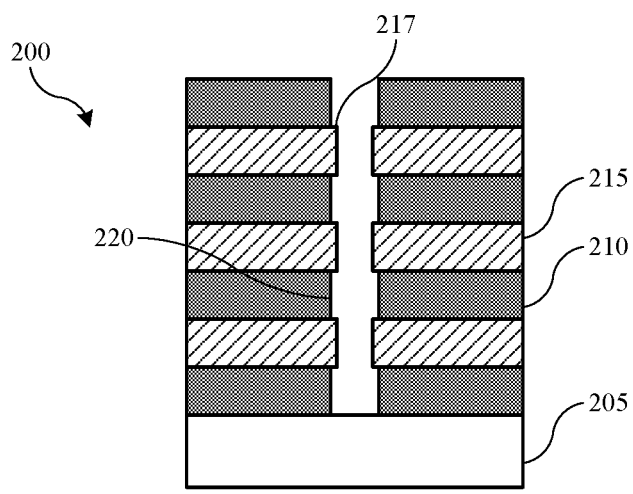
FIGS. 2A-2C show schematic cross-sectional views of an exemplary substrate being processed according to the present technology.
Figure 2B:
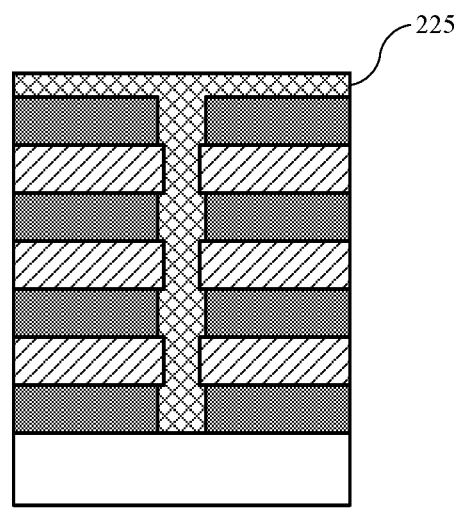
Figure 2C:
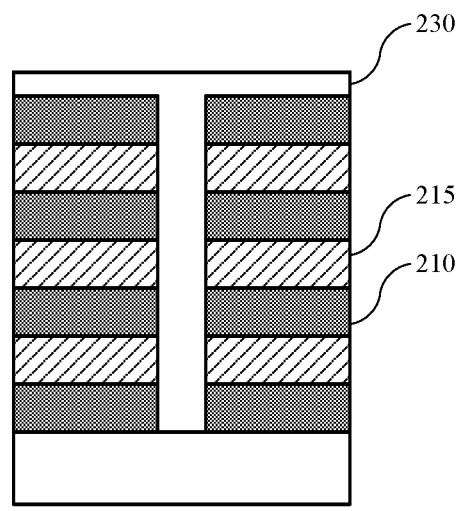

Turning to FIGS. 2A-2C is shown schematic cross-sectional views of an exemplary structure 200 being processed according to the present technology. Structure 200 may be a partial view of a semiconductor substrate on which processing is being performed. For example, structure 200 may include a variety of features across the substrate while the figures illustrate a single exemplary feature not intended to limit the described technology. As illustrated in FIG. 2A, structure 200 may include a base substrate 205, which may be or include silicon or other semiconductor materials or devices on which materials may be formed.

Structure 200 may include layers of material overlying the substrate 205 in embodiments. For example, alternating layers of material may be formed overlying the substrate, such as in a memory or other semiconductor structure. The layers of material may include an oxygen-containing material 210, such as silicon oxide, and may include a nitrogen-containing material 215, such as silicon nitride. In other embodiments any other materials utilized in semiconductor processing may be utilized, and which may be etched according to the present technology. Although FIG. 2 illustrates one structure on which the present technology may be performed, the technology is not so limited. For example, the present technology may be performed on any structure in which a controlled etch may be used where the etch may be characterized by discreet initiation and terminations, such as with the present technology.

Although the figures illustrate seven layers of alternating materials, it is to be understood that the present technology is not so limited. For example, structures on which the present technology may be utilized may include two or more exposed materials in various formations. In structures on which the materials are layered as illustrated, or in different types of structures such as in different orientations, the structure 200 may include any number of layers of materials such as greater than or about 2, greater than or about 5, greater than or about 10, greater than or about 20, greater than or about 30, greater than or about 50, greater than or about 70, greater than or about 100, or more. Previous processing or formation operations may have produced a trench 220, or hole or other feature, which may include sidewalls or surfaces defined by the alternating layers of material. As illustrated, the trench 220 may not have a uniform or consistent sidewall profile. Nitrogen-containing material 215 may extend within trench 220, and may include overhang portion 217 extending beyond oxide material 210.

As shown in FIG. 2B, an etchant 225 may be applied to the substrate. Etchant 225 may be provided at a temperature below 100° C. to limit etching before the etchant has fully penetrated the features across the substrate. Once the etchant has been evenly distributed across the substrate and within any features of the substrate, the temperature may be raised to a second temperature as previously described to perform a selective etch, which may preferentially remove the overhang portion of the nitrogen-containing material. After a period of time proportional to the amount of material to be etched, a diluent 230 may be applied as illustrated in FIG. 2C. The diluent may displace, dilute, or otherwise reduce the efficacy of the etchant. For example, the diluent may rapidly reduce the temperature and/or concentration of the etchant across and within the substrate. The etch process may be quenched with the diluent, which may provide a uniform termination to the etch to facilitate a more uniform removal across and within the substrate.

Subsequent the etching operations, the sidewalls of the trench or feature may be more uniform than before the etch process. For example, the uniformity of the alternating layers of material may be improved by reducing the overhang of material by greater than or about 50%, depending on the thickness of the material to be removed. For example, a smaller tolerance may be afforded by the present technology when a larger amount of material is removed by the etch process. When 20 nm of material is removed, a uniformity of the alternating layers of less than or about 10% may involve a tolerance of +/−2 nm, while a removal operation of 20 Å may not provide similar tolerance. For example, 10% of 20 Å is 2 Å, which may be less than the thickness of a molecule of material. Accordingly, the present technology may etch nitride material across and within a substrate within a tolerance of less than or about 50% of an amount of material removed from the substrate.

For example, if the amount of material removed is less about 10 nm, the nitride material may be uniformly removed within a tolerance of +/−about 5 nm in embodiments. In some embodiments, the nitride material may be etched across and within a substrate within a tolerance of less than or about 40% of an amount of material removed, less than or about 30%, less than or about 20%, less than or about 10%, less than or about 5%, less than or about 1%, less than or about 10 molecular layers, less than or about 9 molecular layers, less than or about 8 molecular layers, less than or about 7 molecular layers, less than or about 6 molecular layers, less than or about 5 molecular layers, less than or about 4 molecular layers, less than or about 3 molecular layers, less than or about 2 molecular layers, less than or about 1 molecular layers, or may be substantially or essentially uniform across and within the substrate in embodiments. This may provide a tolerance of less than or about 20 nm, less than or about 10 nm, less than or about 5 nm, less than or about 4 nm, less than or about 3 nm, less than or about 2 nm, less than or about 1 nm, less than or about 9 Å, less than or about 8 Å, less than or about 7 Å, less than or about 6 Å, less than or about 5 Å, less than or about 4 Å, less than or about 3 Å, less than or about 2 Å, or may provide essentially uniform removal across and/or within a substrate in embodiments.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the agent" includes reference to one or more agents and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of etching a semiconductor substrate, the method comprising:
    applying an etchant to the semiconductor substrate, wherein the semiconductor substrate includes an exposed region of an oxygen-containing material and an exposed region of a nitrogen-containing material, wherein the etchant as applied to the semiconductor substrate comprises phosphoric acid and tetraethyl orthosilicate, and wherein the etchant as applied to the semiconductor substrate is delivered at a first temperature below or about 50° C.;
    heating the semiconductor substrate from the first temperature to a second temperature;
    maintaining the semiconductor substrate at the second temperature for a period of time sufficient to perform an etch of the nitrogen-containing material relative to the oxygen-containing material; and
    quenching the etch subsequent the period of time.

2. The method of etching a semiconductor substrate of claim 1, wherein the second temperature is above about 100° C.

3. The method of etching a semiconductor substrate of claim 1, wherein the etchant comprises phosphoric acid at a concentration of at least about 60% by volume.

4. The method of etching a semiconductor substrate of claim 1, wherein the period of time is less than or about 60 seconds.

5. The method of etching a semiconductor substrate of claim 1, wherein the semiconductor substrate is heated from the first temperature to the second temperature in less than or about 10 seconds.

6. The method of etching a semiconductor substrate of claim 1, wherein the quenching comprises contacting the semiconductor substrate with a volume of deionized water.

7. The method of etching a semiconductor substrate of claim 6, wherein the quenching reduces the etch rate by at least a factor of 10 in less than or about 10 seconds.

8. A method of etching a semiconductor substrate, the method comprising:
    applying an etchant to the semiconductor substrate, wherein the semiconductor substrate includes alternating layers of an oxide material and a nitride material, wherein the etchant as applied comprises phosphoric acid and at least one of soluble silicate or fluorine-containing material, and wherein the substrate and the etchant as applied to the semiconductor substrate are maintained at a first temperature below or about 50° C.;
    subsequent applying the etchant, heating the semiconductor substrate from the first temperature to a second temperature greater than or about 100° C. in less than or about 30 seconds;
    maintaining the semiconductor substrate at the second temperature for a period of time;
    etching the nitride material relative to the oxide material at a selectivity greater than or about 10:1; and
    diluting the etchant to terminate the etching.

9. The method of etching a semiconductor substrate of claim 8, wherein the semiconductor substrate is heated to a temperature of above or about 150° C.

10. The method of etching a semiconductor substrate of claim 8, wherein less than or about 200 mL of etchant is applied to the semiconductor substrate.

11. The method of etching a semiconductor substrate of claim 8, further comprising rotating the semiconductor substrate during the heating.

12. The method of etching a semiconductor substrate of claim 8, wherein a rate of etching the nitride material is greater than or about 100 Å per minute.

13. The method of etching a semiconductor substrate of claim 8, wherein the nitride material is etched uniformly across the semiconductor substrate within a tolerance of less than or about 30% of an amount of the nitride material etched.

14. The method of etching a semiconductor substrate of claim 8, wherein diluting the etchant reduces a temperature of the etchant below about 100° C. in less than or about 10 seconds.

15. The method of etching a semiconductor substrate of claim 8, wherein the etchant comprises phosphoric acid at a concentration of at least about 75% by volume.

16. The method of etching a semiconductor substrate of claim 8, wherein additional etchant is not applied during the etching process.

17. The method of etching a semiconductor substrate of claim 8, wherein the amount of nitride material etched is less than or about 100 A.

18. The method of etching a semiconductor substrate of claim 8, wherein the semiconductor substrate defines a hole or trench through the alternating layers of the oxide material and the nitride material, and wherein sidewalls of the hole or trench include an overhang of the silicon nitride material of less than or about 500 nm.

19. The method of etching a semiconductor substrate of claim 8, wherein the period of time is a first period of time, and wherein the method further comprises:

prior to heating the semiconductor substrate, flowing the etchant across the substrate for a second period of time.

* * * * *